United States Patent
Kwan (10) Patent No.: US 8,977,943 B2
(45) Date of Patent: Mar. 10, 2015

(54) IMPLEMENTATION OF CRC32 USING CARRYLESS MULTIPLIER

(71) Applicant: Advanced Micro Devices, Inc., Synnyvale, CA (US)

(72) Inventor: Bill K. C. Kwan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 232 days.

(21) Appl. No.: 13/732,336

(22) Filed: Dec. 31, 2012

(65) Prior Publication Data

US 2014/0189474 A1 Jul. 3, 2014

(51) Int. Cl.
H03M 13/00 (2006.01)
H03M 13/09 (2006.01)

(52) U.S. Cl.
CPC .................................. *H03M 13/091* (2013.01)
USPC .......................................... 714/801; 714/781

(58) Field of Classification Search
USPC ............ 714/48, 801, 758, 807, 781; 708/204
See application file for complete search history.

(56) References Cited

U.S. PATENT DOCUMENTS

| | | | | |
|---|---|---|---|---|
| 7,886,210 B2 * | 2/2011 | Leonard et al. | ................ | 714/758 |
| 8,001,446 B2 * | 8/2011 | Walma | ........................... | 714/781 |
| 8,136,010 B2 * | 3/2012 | Leonard et al. | ................ | 714/758 |
| 8,380,767 B2 * | 2/2013 | Ozturk et al. | .................. | 708/204 |
| 2009/0024900 A1 * | 1/2009 | Wilkinson et al. | ............ | 714/758 |

* cited by examiner

*Primary Examiner* — David Ton (57) ABSTRACT

Methods, apparatus, and fabrication processes relating to implementing cyclic redundancy checks (CRCs) in processors, such as CRC32 instructions in x86 computer architectures. A method may comprise extracting a first CRC value from a data packet, performing a carryless operation upon the data packet to determine a second CRC value, and determining that a data error is present in the data packet when the first and second CRC values do not match.

31 Claims, 5 Drawing Sheets

IMPLEMENTATION OF CRC32 USING CARRYLESS MULTIPLIER

BACKGROUND

1. Technical Field

Generally, the present disclosure relates to integrated circuits, and, more particularly, to the implementation of cyclic redundancy checks by such systems.

2. Description of the Related Art

A cyclic redundancy check (CRC) is an error-detecting code which may be used to detect accidental changes to transmitted data. A check value is attached to a data block of interest, wherein the check value is determined from the remainder of a polynomial division (or corresponding output of another mathematical operation) of the data block; later, such as on receipt of the data block after network transmission, the calculation may be repeated, with a finding the check values do not match indicating presumed data corruption. A new x86 instruction called CRC32 (Accumulate CRC32 Value) was added to the Intel SSE4.2 Specification, which uses polynomial 11EDC6F41 to generate a remainder of up to 32 bits. CRC instructions may be used in cryptography, digital rights management, and transmission error detection.

The CRC calculation has been implemented by other workers in a serial fashion, by a linear feedback shift register (LFSR) network consisting of XORs and flops based on the polynomial. The input is fed into the LFSR network at the rate of one bit per clock cycle. Depending on the length of the input, the remainder is obtained in the flops after some latency. E.g., for a 64 bit input, the remainder is obtained after 64 clock cycles. This approach is thus slow and does not meet the latency requirement of many applications, e.g., cryptographic applications, where the data sizes are much larger.

SUMMARY OF EMBODIMENTS OF THE DISCLOSURE

The apparatus, systems, and methods in accordance with the embodiments of the present disclosure may implement CRC32 instructions using a carryless multiplier, resulting in roughly 20-fold faster implementation than the linear feedback shift register technique known in the art. Mechanisms capable of implementing CRC32 instructions with this improved speed may be formed within a microcircuit by any means, such as by growing or deposition.

An apparatus in accordance with some embodiments of the present disclosure includes a CRC unit configured to extract a first CRC value from a data packet, perform a carryless operation upon the data packet to determine a second CRC value, and determine that a data error is present in the data packet when the first and second CRC values do not match.

An apparatus in accordance with some embodiments of the present disclosure includes a CRC unit configured to modify an input, x, having a first number of bits to have 64 bits, resulting in a modified input, $R(x)$; calculate an $x^{32}$ modulus based at least on the modified input $R(x)$ and a polynomial, $P(x)$, having a degree of 32; extract the coefficients of $x^n$, wherein n is incremented from 0 to 31; and accumulate a cyclic redundancy check (CRC) value, wherein the CRC value comprises the coefficients.

A method in accordance with some embodiments of the present disclosure comprises extracting a first CRC value from a data packet, performing a carryless operation upon the data packet to determine a second CRC value, and determining that a data error is present in the data packet when the first and second CRC values do not match.

A method in accordance with some embodiments of the present disclosure comprises modifying an input, x, having a first number of bits to have 64 bits, resulting in a modified input, $R(x)$; calculating an $x^{32}$ modulus based at least on the modified input $R(x)$ and a polynomial, $P(x)$, having a degree of 32; extracting the coefficients of $x^n$, wherein n is incremented from 0 to 31; and accumulating a cyclic redundancy check (CRC) value, wherein the CRC value comprises the coefficients.

Some embodiments described herein may be used in any type of integrated circuit that requires CRC values generated by implementation of a CRC instruction, such as a CRC32 instruction. One example is a general purpose microprocessor.

BRIEF DESCRIPTION OF THE FIGURES

The particular embodiments disclosed will hereafter be described with reference to the accompanying drawings, wherein like reference numerals denote like elements, and.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

Some embodiments of the present disclosure provide for improved implementation of the CRC32 instruction in x86 architecture. These improvements may comprise execution of the CRC32 instruction on a 64-bit input data in roughly 3 cycles, rather than the 64 cycles required by the linear feedback shift register technique known in the prior art.

Figure 1:
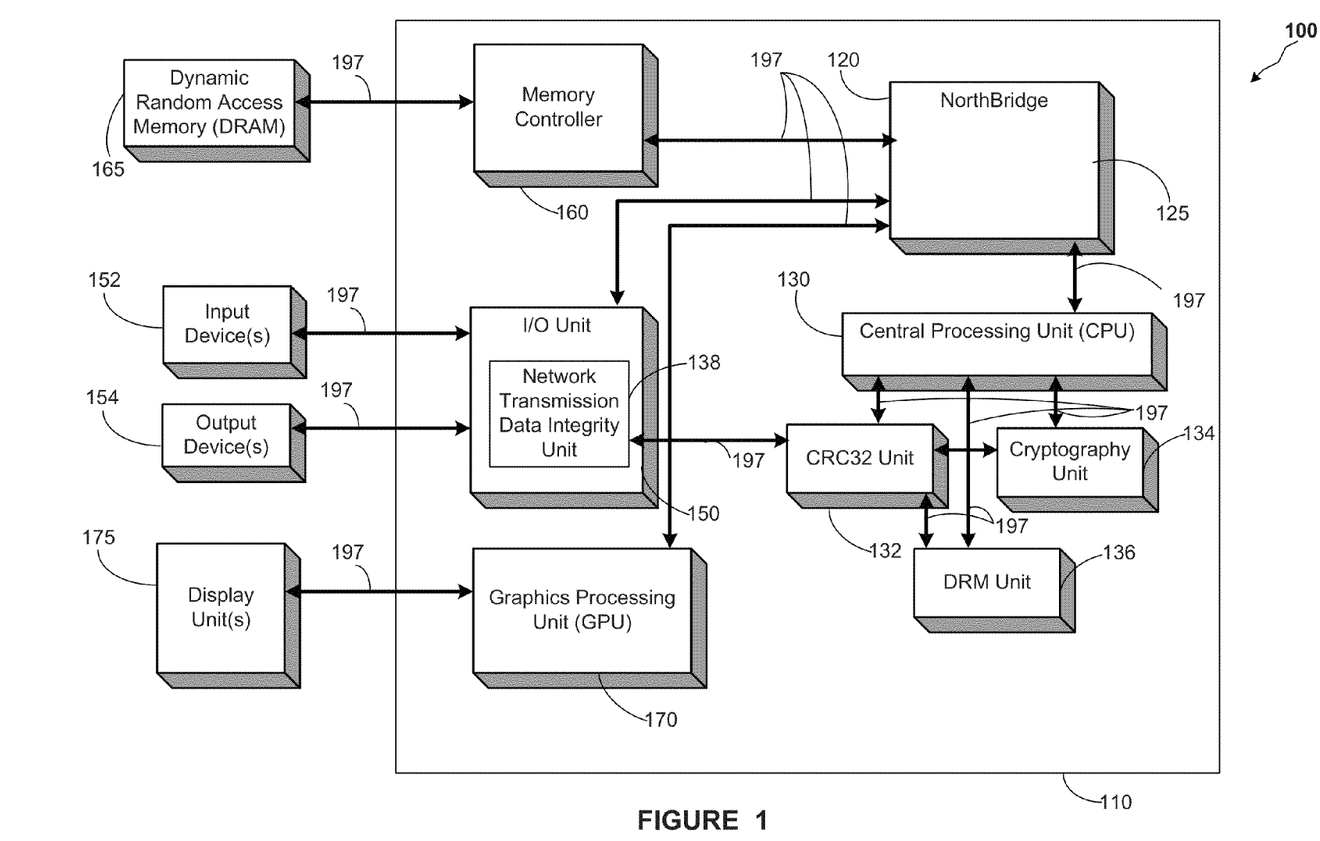
FIG. 1 is a simplified block diagram of a microcircuit design, in accordance with an embodiment of the disclosure.

Turning now to FIG. 1, a block diagram, a stylized representation of a computer system 100, comprising a processor 110, is illustrated. The processor 110 may comprise a northbridge 120. The northbridge 120 may perform various operations known the person of ordinary skill in the art. The processor 110 may comprise a central processing unit (CPU) 130. The processor 110 may also comprise other components, such as an I/O unit 150 configured to receive user input from input devices 152 (e.g., keyboards, mice, trackballs, touchpads, touchscreens, microphones, etc.) and send output to output devices 154 (e.g., speakers, headphones, etc.) via data channels 197. The I/O unit 150 may be further configured to receive and transmit data over a network. To assist the latter functionality, the I/O unit 150 may comprise a network transmission data integrity unit 138, which will be discussed in more detail below. The processor 110 may also comprise a memory controller 160 configured to send and receive data to a memory, such as a dynamic random access memory (DRAM) 165, via a data channel 197. The processor 110 may also comprise a graphics processing unit (GPU) 160 configured to send output to display unit(s) 175 via a data channel 197. In particular embodiments (not shown), the GPU 160 may comprise one or more GPU cores, similar to the compute units 135 shown in the CPU 130.

The processor 110 may also comprise a CRC unit 132. In some embodiments, the CRC unit 132 may be capable of performing a CRC32 instruction. In some embodiments, CRC unit 132 may be configured to receive a data packet; extract a first CRC value from the data packet; perform a carryless operation upon the data packet to determine a second CRC value; determine whether the first and second CRC values match; and determine that a data error is present in the data packet in response to determining that said first and second CRC values do not match.

In some embodiments, the CRC unit 132 may be configured to receive an input, x, having a first number of bits. For example, the input may have 8, 16, 32, or 64 bits. The input may be received from any other component of computer system 100 that may need to accumulate a CRC value from the input. For example, the input may be received from the CPU 130, or a cryptography unit 134, a digital rights management (DRM) unit 136, or a network transmission data integrity unit 138, among others.

The CRC unit 132 may also be configured to modify the input to have 64 bits, resulting in a modified input, R(x). The CRC unit 132 may perform different operations depending on the first number of bits in the input. If the first number of bits is 8, 16, or 32, the CRC unit 132 may be configured to modify the input by padding the input to have 64 bits. In some embodiments, padding in this context may refer to the addition of bits with value "0" until the number of bits is 64. If the first number of bits is 64, the CRC unit 132 may be configured to modify the input by padding the input to have 96 bits and "folding" the 96 bit input into a 64 bit input. Folding may comprise performing a carryless multiplication of the upper 32 bits of the 96-bit input data with ($x^{64}$ mod P(x), with P(x) described in more detail below) and then performing an XOR operation with the lower 64 bits of the 96-bit input data. The result of folding is a 64-bit data sequence with the lower 32-bits being non-zero, and thus resembled a 64-bit input similar to the modified input produced by padding the non-64-bit input cases discussed above.

The CRC unit 132 may also be configured to calculate an $x^{32}$ modulus based at least on the modified input and a polynomial with degree 32.

In some embodiments, the CRC unit 132 may be configured to calculate the $x^{32}$ modulus by the following. The CRC unit 132 may be configured to receive the polynomial, P(x), having a degree of 32. In some embodiments, polynomial P(x) may be identified by the hexadecimal notation 11EDC6F41H, which notation is known to the person of ordinary skill in the art and which is also known to refer to a polynomial called for by International Telecommunications Union (ITU) standards relating to network transmission data integrity. Because the polynomial P(x) is predetermined, receipt of the polynomial by CRC unit 132 may be performed at any time prior to the need for the polynomial P(x) by other functions of the CRC unit 132. In some embodiments, receipt of the polynomial may occur essentially upon startup of the computer system 100 comprising CRC unit 132.

The CRC unit 132 may also be configured to calculate a quotient, u, equal to the floor of $x^{064}$/P(x). Because both $x^{64}$ and P(x) are predetermined and invariate, $x^{64}$ mod P(x) is a constant and may be pre-calculated at any time prior to the need for quotient u by other functions of the CRC unit 132. The output of $x^{64}$ mod P(x) is 32-bit data.

The CRC unit 132 may also be configured to calculate a first factor, T1(x), equal to the floor of R(x)/$x^{32}$, times u. In addition, the CRC unit 132 may be configured to calculate a second factor, T2(x), equal to the floor of T1(x)/$x^{32}$, times P(x). Further, the CRC unit 132 may be configured to calculate a product, C(x), equal to R(x) XOR T2(x) mod $x^{32}$. The CRC unit 132 may also be configured to extract the coefficients of $x^n$, wherein n is incremented from 0 to 31. The CRC unit 132 may then be configured to accumulate a cyclic redundancy check (CRC) value, wherein the CRC value comprises the coefficients extracted above from $x^n$.

Figure 2:
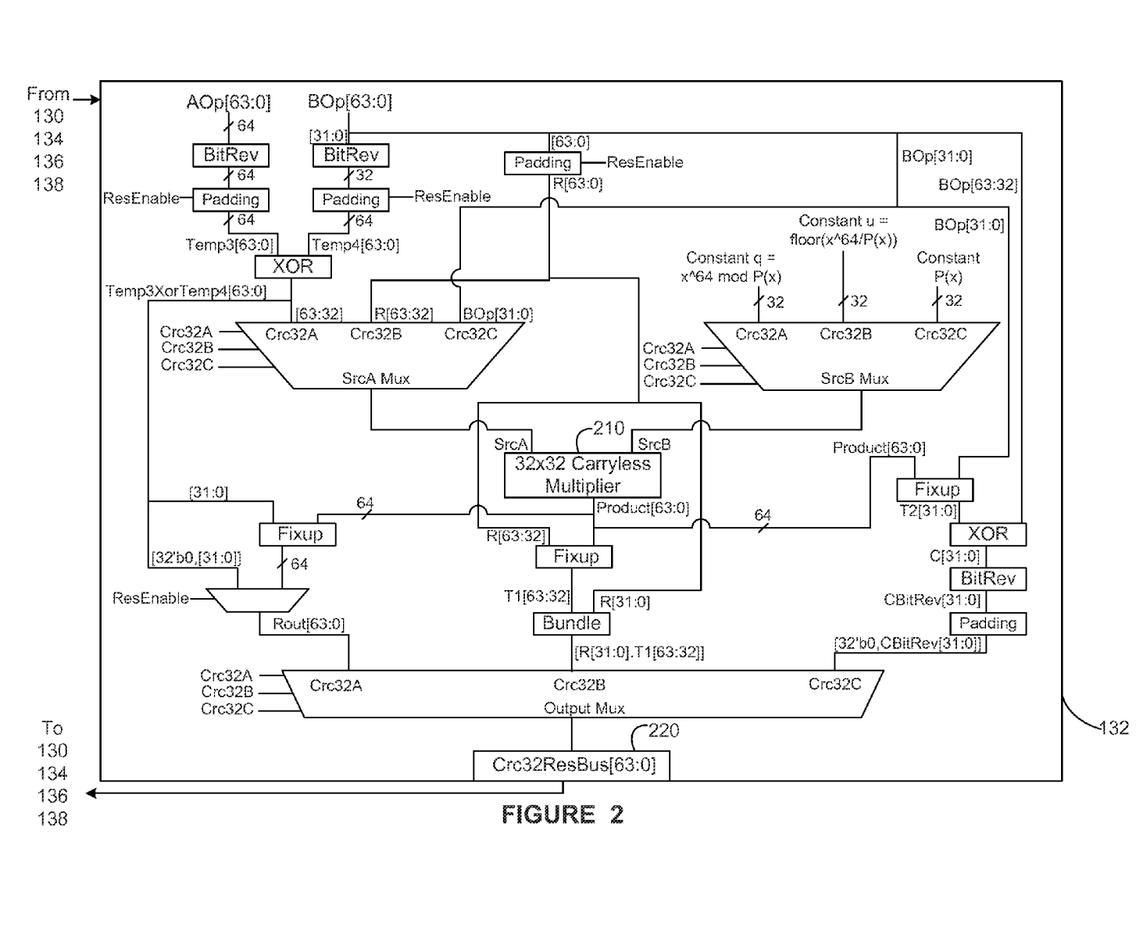
FIG. 2 is a simplified schematic diagram of a CRC unit, in accordance with some embodiments of the disclosure.

Turning ahead to FIG. 2, a CRC unit 132, according to some embodiments, is shown in more detail. In the depicted embodiment, the CRC unit 132 is configured to implement three microoperations, CRC32A, CRC32B and CRC32C. The CRC32 instruction may be implemented using microcode engine performing these three microoperations in sequential order A-B-C. Each microoperation takes 1 system clock cycle to finish. Generally, the output of a cycle is treated as the input operand to the next cycle, until the results are available at the end of the third cycle.

For a non-64-bit operand, e.g., the 8-, 16-, or 32-bit cases discussed above, two 32-bit-by-32-bit carryless multiplications are performed, one each in CRC32B and CRC32C.

For a 64-bit operand, as discussed above, a folding step is performed to make the 96-bit operand (after padding) into a 64-bit intermediate data, before invoking the two 32-bit-by-32-bit carryless multiplications. The folding step may be performed in CRC32A and requires one 32-bit-by-32-bit carryless multiplication. The CRC32B and CRC32C microoperations will each require a 32-bit-by-32-bit carryless multiplication.

There is only one carryless multiplier in the example design. It may be used in a sequential fashion by CRC32A, CRC32B and then CRC32C. Although the non-64-bit operand case does not require a folding step, CRC32A may still be used to do initial bit reflection and shifting on a non-64-bit operand, as required, but with the carryless multiplication bypassed. Use of CRC32A in the non-64-bit case may also keep latency uniform across different data sizes.

The folding step in a 64-bit input operand case can be described mathematically as:

$$F(x)=A(x)*x^{64}+B(x)$$

F(x) represents the 96-bit polynomial after the padding step, A(x) is of degree 32, and B(x) is of degree 64. The lower 32 bits are zero. The folding step may be considered as partitioning F(x) into 2 unequal portions.

The result of F(x) mod P(x) over GF(2) may then be found:

$$\begin{aligned}F(x) \bmod P(x) &= [A(x)*x^{64} + B(x)] \bmod P(x) \\ &= [(A(x)*x^{64}) \bmod P(x) + B(x)] \bmod P(x) \\ &= [(A(x)*(x^{64} \bmod P(x)) + B(x)] \bmod P(x)\end{aligned}$$

Since P(x) is a fixed polynomial, $x^{64}$ mod P(x) can also be pre-calculated and is a 32-bit data sequence. It becomes a 32-bit A(x) carryless-multiplication with a 32-bit value of $x^{64}$ mod P(x), producing a 64-bit data sequence. To this may then be added the (64-bit) B(x), resulting in a 64-bit data sequence that may possibly carry non-zeros in its lower 32 bits. The 64-bit data sequence may then be treated as in the non-64-bit input operand case.

Since there are about ten to fifteen levels of logic within the CRC unit 132 in some embodiments, depending on the specific implementation, there may be greater hardware complexity and die area footprint compared to the linear feedback shift register technique known in the art. However, the CRC unit 132 may complete its operations within 3 microoperations, each using the single carryless multiplier for one clock cycle each. If the CRC unit 132 is part of a processor 110 capable of executing a number of pipes n, the number of results which can be achieved are n/3 results/cycle, with a minimum latency of 3 cycles. The linear feedback shift register known in the art has a latency of y cycles, where y is the number of bits in the input data sequence.

FIG. 2 shows the exemplary datapath in more detail.

A 32-bit data multiplied by another 32-bit data in a carryless fashion will produce a 64-bit product. With area, timing and complexity consideration, partial products are calculated and are divided into 4 quarters. A final step of XOR combines these quarters of partial products into the final 64 bits product.

An example RTL pseudo-code is as below.

```
input [31:0]    SrcA;
input [31:0]    SrcB;
output [63:0]   Product;
//                              ===                     DATAPATH
================================================================================
        reg [62:0] PartialProd[31:0];
        reg [38:0] PP07to00;
        reg [46:8] PP15to08;
        reg [54:16] PP23to16;
        reg [62:24] PP31to24;
        // Partial product per row, for 32 rows, each for one bit of
SrcB
           `for(row2=0; row2<32; row2++)
               PartialProd[`row2][62:0]    =   {31'b0,    SrcA[31:0]    &
{32{SrcB[`row2]}}}<<`row2;
           `endfor
           // First quarter of array
           `for(col2=0; col2<39; col2++)
               PP07to00[`col2] =       PartialProd[0][`col2]     ^
                                       PartialProd[1][`col2]     ^
                                       PartialProd[2][`col2]     ^
                                       PartialProd[3][`col2]     ^
                                       PartialProd[4][`col2]     ^
                                       PartialProd[5][`col2]     ^
                                       PartialProd[6][`col2]     ^
                                       PartialProd[7][`col2];
           `endfor
           // Second quarter of array
           `for(col2=8; col2<47; col2++)
               PP15to08[`col2] =       PartialProd[8][`col2]     ^
                                       PartialProd[9][`col2]     ^
                                       PartialProd[10][`col2]    ^
                                       PartialProd[11][`col2]    ^
                                       PartialProd[12][`col2]    ^
                                       PartialProd[13][`col2]    ^
                                       PartialProd[14][`col2]    ^
                                       PartialProd[15][`col2]
           `endfor
           // Third quarter of array
           `for(col2=16; col2<55; col2++)
               PP23to16[`col2] =       PartialProd[16][`col2]    ^
                                       PartialProd[17][`col2]    ^
                                       PartialProd[18][`col2]    ^
                                       PartialProd[19][`col2]    ^
                                       PartialProd[20][`col2]    ^
                                       PartialProd[21][`col2]    ^
                                       PartialProd[22][`col2]    ^
                                       PartialProd[23][`col2]
           `endfor
           // Fourth quarter of array
           `for(col2=24; col2<63; col2++)
               PP31to24[`col2] =       PartialProd[24][`col2]    ^
                                       PartialProd[25][`col2]    ^
                                       PartialProd[26][`col2]    ^
                                       PartialProd[27][`col2]    ^
                                       PartialProd[28][`col2]    ^
                                       PartialProd[29][`col2]    ^
```

```
                                        PartialProd[30][ col2]
                                        PartialProd[31][ col2]
        endfor
        // One final XOR to combine the columns
        assign(Product[63:0],   {1'b0,
                                        PP31to24[62:55],
                                        PP31to24[54:47]   PP23to16[54:47],
                                        PP31to24[46:39]   PP23to16[46:39]
PP15to08[46:39],
                                        PP31to24[38:32]   PP23to16[38:32]
PP15to08[38:32]   PP07to00[38:32],
                                        PP31to24[31:24]   PP23to16[31:24]
PP15to08[31:24]   PP07to00[31:24],
                                                          PP23to16[23:16]
PP15to08[23:16]   PP07to00[23:16],
PP15to08[15: 8]    PP07to00[15: 8],
PP07to00[ 7: 0]   });
```

A final bus, Crc32ResBus 220, carries the CRC32 value to various arithmetic logic units (ALUs), such as a cryptography unit 134, a DRM unit 136, a network transmission data integrity unit 138, or an ALU of CPU 130.

Although CRC unit 132 is depicted in FIG. 1 as a separate unit from e.g. compute unit 130, in some embodiments, the CRC unit 132 may be a component of compute unit 130.

Returning to FIG. 1, in some embodiments, the computer system 100 may comprise one or more other components. In some embodiments, the computer system 100 may further comprise a cryptography unit 134 configured to receive the CRC value from the CRC unit 132 and perform a cryptography operation using the CRC value. Alternatively or in addition, the computer system 100 may further comprise a digital rights management (DRM) unit configured to receive the CRC value from the CRC unit 132 and perform a DRM operation using the CRC value. Alternatively or in addition, the computer system 100 may further comprise a network transmission data integrity unit configured to receive the CRC value from the CRC unit 132 and perform a network transmission data integrity operation using the CRC value.

Although cryptography unit 134 and DRM unit 136 are depicted in FIG. 1 as separate units from e.g. compute unit 130, in some embodiments, one or more of cryptography unit 134 or DRM unit 136 may be components of compute unit 130. Similarly, in some embodiments, network transmission data integrity unit 138 may be a separate unit from I/O unit 150 or may be a component of compute unit 130.

Figure 3A:
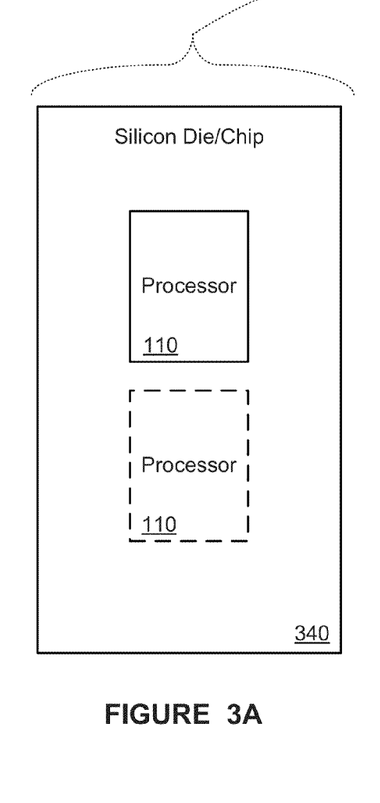
FIG. 3A provides a representation of a silicon die/chip that includes one or more systems-on-chip as shown in FIG. 1, in accordance with an embodiment of the disclosure.

Turning now to FIG. 3A, in some embodiments, the processor 110 of the integrated circuit device may reside on a silicon die/chip 340. The silicon die/chip 340 may be housed on a motherboard or other structure of a computer system. In one or more embodiments, there may be more than one processor 110 on each silicon die/chip 340. Various embodiments of the processor 110 may be used in a wide variety of electronic devices.

Figure 3B:
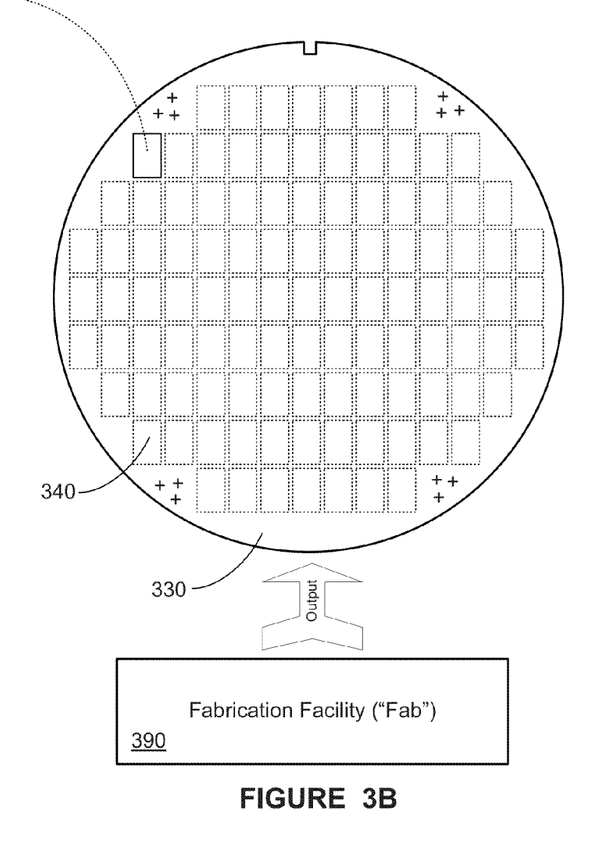
FIG. 3B provides a representation of a silicon wafer which includes one or more dies/chips that may be produced in a fabrication facility, in accordance with an embodiment of the disclosure.

Turning now to FIG. 3B, in accordance with some embodiments, and as described above, the processor 110 may be included on the silicon chip/die 340. The silicon chip/die 340 may contain one or more different configurations of the processor 110. The silicon chip/die 340 may be produced on a silicon wafer 330 in a fabrication facility (or "fab") 390. That is, the silicon wafer 330 and the silicon die/chip 340 may be referred to as the output, or product of, the fab 390. The silicon chip/die 340 may be used in electronic devices.

The circuits described herein may be formed on a semiconductor material by any known means in the art. Forming can be done, for example, by growing or deposition, or by any other means known in the art. Different kinds of hardware descriptive languages (HDL) may be used in the process of designing and manufacturing the microcircuit devices. Examples include VHDL and Verilog/Verilog-XL. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in one embodiment, may be used to configure a manufacturing facility (e.g., through the use of mask works) to create devices capable of embodying various aspects of the instant disclosure. As understood by one or ordinary skill in the art, it may be programmed into a computer, processor, or controller, which may then control, in whole or part, the operation of a semiconductor manufacturing facility (or fab) to create semiconductor products and devices. These tools may be used to construct the embodiments of the disclosure described herein.

Figure 4:
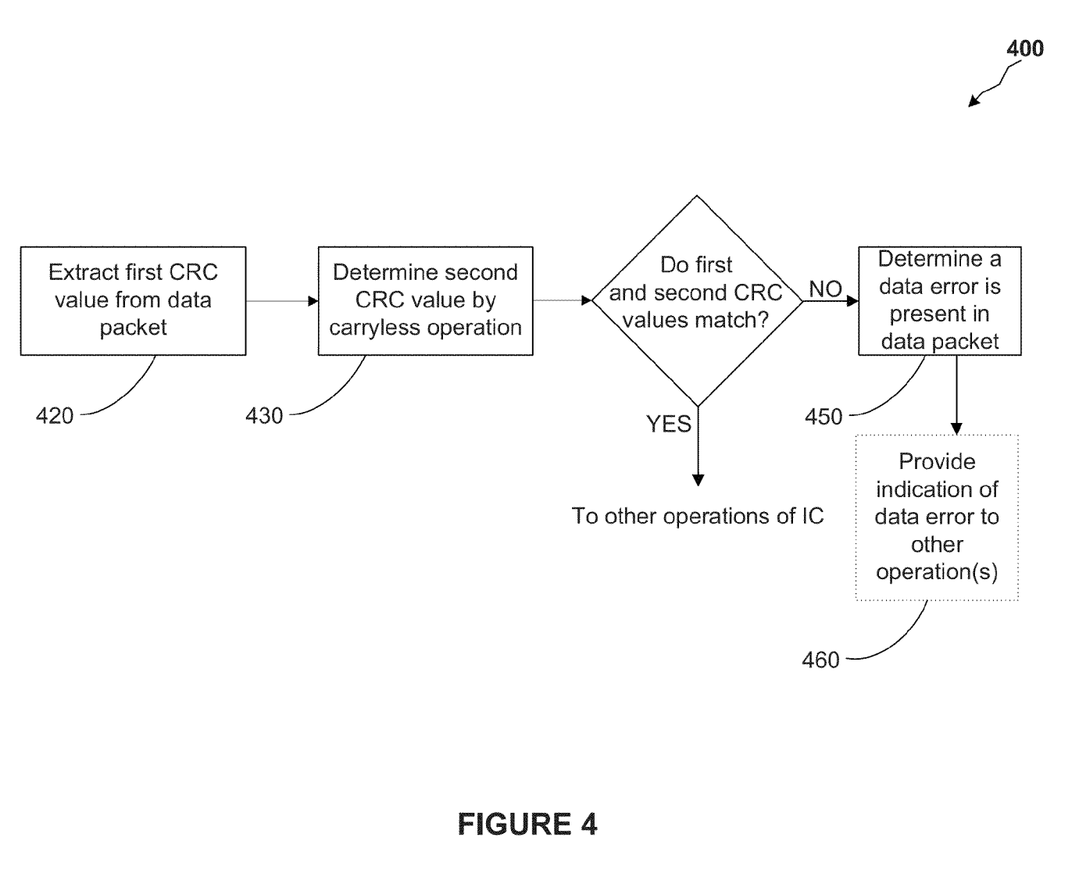
FIG. 4 is a flowchart of a method relating to determining a data error by determining whether two CRC values match, in accordance with some embodiments of the disclosure.

FIG. 4 presents a flowchart depicting a method 400 according to some embodiments of the present disclosure. In the depicted embodiment, the method 400 may comprise extracting at 420 a first CRC value from a data packet. The data packet may comprise both (a) data useful to an operation of an integrated circuit device, wherein it may be desirable to check the integrity of the data, and (b) a first CRC value previously generated.

The method 400 may comprise performing at 430 a carryless operation upon the data packet to determine a second CRC value. In some embodiments, performing at 430 the carryless operation may comprises arranging the data packet as a 64 bit word; performing a double 32-bit operation upon said 64-bit word; and determining the second CRC value based upon said 32-bit operation.

When the first and second CRC values match, the integrity of the data packet may be confirmed and the data packet may be used in one or more other operations of the integrated circuit device. When they do not match, the method 400 may comprise determining at 450 that a data error is present in the data packet.

In the event a data error is present, as determined at 450, the method may further comprise providing at 460 an indication of the data error to at least one of a cryptography operation, a digital rights management operation, or a network transmission data integrity operation.

Figure 5:
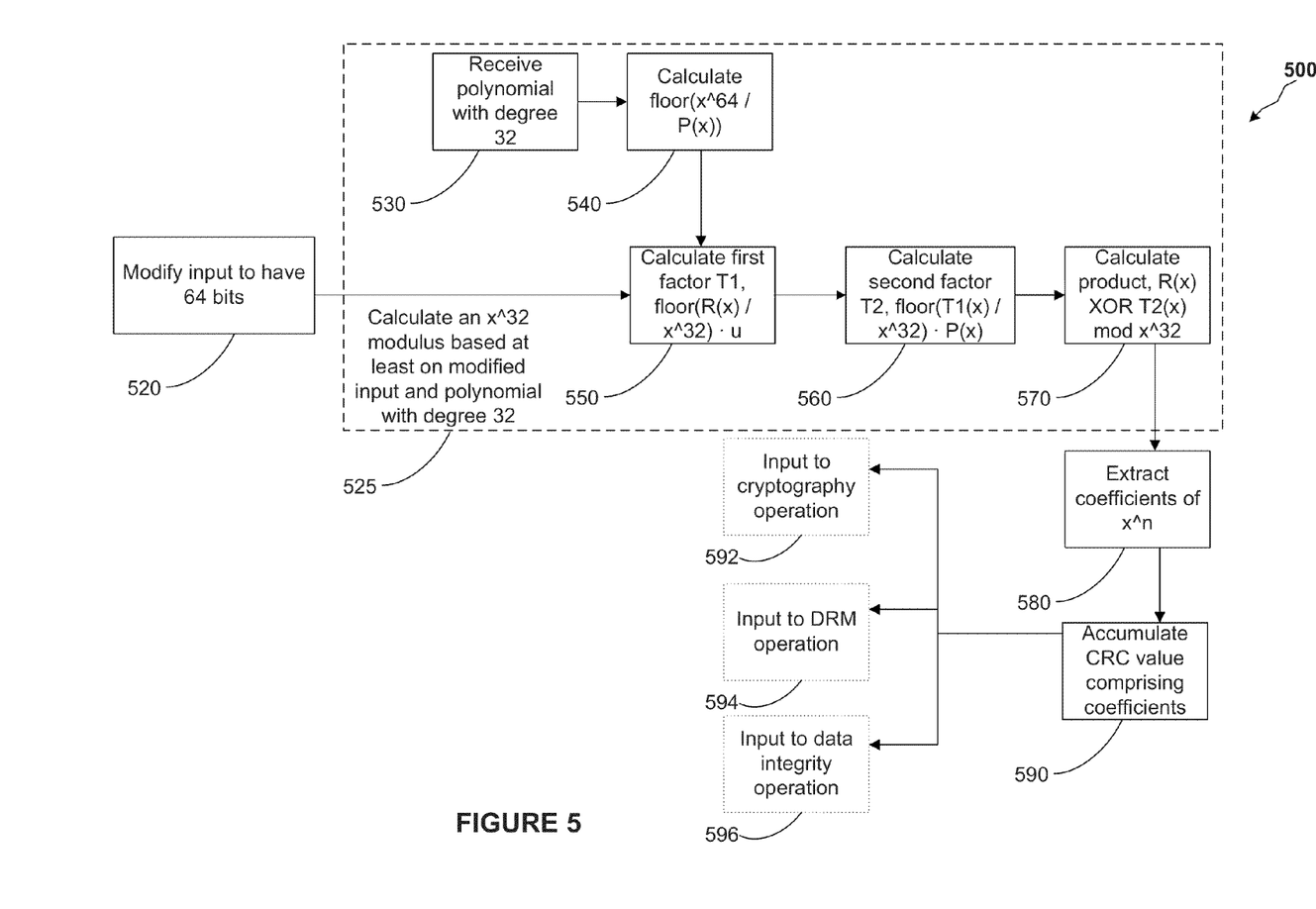
FIG. 5 is a flowchart of a method relating to accumulating a CRC value, in accordance with some embodiments of the disclosure.

FIG. 5 presents a flowchart depicting a method 500 according to some embodiments of the present disclosure. In the depicted embodiment, the method 500 may comprise modifying at 520 an input, x, having a first number of bits, to have 64 bits, resulting in a modified input, R(x). If the first number of bits is 8, 16, or 32, modifying the input at 520 may comprise padding the input to have 64 bits. If the first number of bits is 64, modifying the input at 520 may comprise padding the input to have 96 bits, and folding the 96 bit input into a 64 bit input.

The method 500 may also comprise calculating at 525 an $x^{32}$ modulus based at least on the modified input, R(x), and a polynomial, P(x), having a degree of 32.

In some embodiments, calculating at 525 may be performed by receiving at 530 a polynomial, P(x), having a degree of 32, and calculating at 540 a quotient, u, equal to the floor of $x^{64}/P(x)$. Because the polynomial P(x) and $x^{64}$ are known values, the receiving at 530 and the calculating at 540 may be performed at any time prior to steps of the method 500 requiring either or both of the polynomial P(x) or $x^{64}$. As discussed above, in some embodiments, the polynomial is 11EDC6F41H.

The method 500 may comprise calculating at 550 a first factor, T1(x), equal to the floor of $R(x)/x^{32}$, times u. The method 500 may also comprise calculating at 560 a second factor, T2(x), equal to the floor of $T1(x)/x^{32}$, times P(x). Thereafter, the method 500 may comprise calculating at 570 a product, C(x), equal to R(x) XOR T2(x) mod $x^{32}$.

However the $x^{32}$ modulus is calculated, the coefficients of $x^n$, wherein n is incremented from 0 to 31, may be extracted at 580. The coefficients extracted at 580 may be used to accumulate at 590 a cyclic redundancy check (CRC) value, wherein the CRC value comprises the coefficients.

In addition to the steps 510-590 discussed above, in some embodiments, the method 500 may comprise inputting the CRC value to one or more other operations. This may comprise inputting at 592 the CRC value to a cryptography operation. The cryptography operation may be performed by a CPU 130 or a cryptography unit 134. Alternatively or in addition, the method 500 may comprise inputting at 594 the CRC value to a DRM operation. The DRM operation may be performed by a CPU 130 or a DRM unit 136. Alternatively or in addition, the method 500 may comprise inputting at 596 the CRC value to a network transmission data integrity operation. The network transmission data integrity operation may be performed by a CPU 130 or a network transmission data integrity unit 138.

The methods illustrated in FIGS. 4-5 may be governed by instructions that are stored in a non-transitory computer readable storage medium and that are executed by at least one processor of the computer system 100. Each of the operations shown in FIGS. 4-5 may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

I claim:

1. A method, comprising:
    extracting a first cyclic redundancy check (CRC) value from a data packet;
    performing a carryless operation upon the data packet to determine a second CRC value; and
    determining that a data error is present in the data packet when the first and second CRC values do not match.

2. The method of claim 1, wherein performing the carryless operation comprises:
    arranging the data packet as a 64-bit word;
    performing a double 32-bit operation upon said 64-bit word; and
    determining the second CRC value based upon said 32-bit operation.

3. The method of claim 1, further comprising:
    providing an indication of the data error to at least one of a cryptography operation, a digital rights management operation, or a network transmission data integrity operation.

4. A method, comprising:
    modifying an input, x, having a first number of bits to have 64 bits, resulting in a modified input, R(x);
    calculating an $x^{32}$ modulus based at least on R(x) and a polynomial, P(x), having a degree of 32;
    extracting the coefficients of $x^n$, wherein n is incremented from 0 to 31; and
    accumulating a cyclic redundancy check (CRC) value, wherein the CRC value comprises the coefficients.

5. The method of claim 4, wherein the calculating the $x^{32}$ modulus comprises:
    calculating a quotient, u, equal to the floor of $x^{64}/P(x)$;
    calculating a first factor, T1(x), equal to the floor of $R(x)/x^{32}$, times u;
    calculating a second factor, T2(x), equal to the floor of $T1(x)/x^{32}$, times P(x); and
    calculating a product, C(x), equal to R(x) XOR T2(x) mod $x^{32}$.

6. The method of claim 4, wherein the polynomial is 11EDC6F41H.

7. The method of claim 4, wherein the first number of bits is 8, 16, or 32, and modifying the input comprises padding the input to have 64 bits.

8. The method of claim 4, wherein the first number of bits is 64, and modifying the input comprises padding the input to have 96 bits; and folding the 96 bit input into a 64 bit input.

9. The method of claim 4, further comprising:
    inputting the CRC value to at least one of a cryptography operation, a digital rights management operation, or a network transmission data integrity operation.

10. An integrated circuit device, comprising:
    a CRC unit configured to:
        extract a first CRC value from a data packet;
        perform a carryless operation upon the data packet to determine a second CRC value; and
        determine that a data error is present in the data packet when the first and second CRC values do not match.

11. The integrated circuit device of claim 10, wherein the CRC unit is configured to perform the carryless operation by being configured to:
   arrange the data packet as a 64-bit word;
   perform a double 32-bit operation upon said 64-bit word; and
   determine the second CRC value based upon said 32-bit operation.

12. The integrated circuit device of claim 10, wherein the CRC unit is further configured to provide an indication of the data error to at least one of a cryptography operation, a digital rights management operation, or a network transmission data integrity operation.

13. An integrated circuit device, comprising:
   a CRC unit configured to:
   modify an input, x, having a first number of bits, to have 64 bits, resulting in a modified input, R(x);
   calculate an x^32 modulus based at least on R(x) and a polynomial, P(x), having a degree of 32;
   extract the coefficients of x^n, wherein n is incremented from 0 to 31; and
   accumulate a cyclic redundancy check (CRC) value, wherein the CRC value comprises the coefficients.

14. The integrated circuit device of claim 13, wherein the CRC unit is configured to calculate the x^32 modulus by:
   calculating a quotient, u, equal to the floor of x^64/P(x);
   calculating a first factor, T1(x), equal to the floor of R(x)/x^32, times u;
   calculating a second factor, T2(x), equal to the floor of T1(x)/x^32, times P(x); and
   calculating a product, C(x), equal to R(x) XOR T2(x) mod x^32.

15. The integrated circuit device of claim 14, wherein the polynomial is 11EDC6F41H.

16. The integrated circuit device of claim 14, wherein the first number of bits is 8, 16, or 32, and the CRC unit is configured to modify the input by padding the input to have 64 bits.

17. The integrated circuit device of claim 14, wherein the first number of bits is 64, and the CRC unit is configured to modify the input by padding the input to have 96 bits and folding the 96 bit input into a 64 bit input.

18. The integrated circuit device of claim 14, further comprising:
   a cryptography unit configured to receive the CRC value from the CRC unit and perform a cryptography operation using the CRC value.

19. The integrated circuit device of claim 14, further comprising:
   a digital rights management unit configured to receive the CRC value from the CRC unit and perform a digital rights management operation using the CRC value.

20. The integrated circuit device of claim 14, further comprising:
   a network transmission data integrity unit configured to receive the CRC value from the CRC unit and perform a network transmission data integrity operation using the CRC value.

21. A non-transitory computer readable storage medium encoded with data that, when implemented in a manufacturing facility, adapts the manufacturing facility to create an integrated circuit device, comprising:
   a CRC unit configured to:
   extract a first CRC value from a data packet;
   perform a carryless operation upon the data packet to determine a second CRC value; and
   determine that a data error is present in the data packet in response to when the first and second CRC values do not match.

22. The non-transitory computer readable storage medium of claim 21, wherein the CRC unit is configured to perform the carryless operation by being configured to:
   arrange the data packet as a 64-bit word;
   perform a double 32-bit operation upon said 64-bit word; and
   determine the second CRC value based upon said 32-bit operation.

23. The non-transitory computer readable storage medium of claim 21, wherein the CRC unit is further configured to provide an indication of the data error to at least one of a cryptography operation, a digital rights management operation, or a network transmission data integrity operation.

24. A non-transitory computer readable storage medium encoded with data that, when implemented in a manufacturing facility, adapts the manufacturing facility to create an integrated circuit device, comprising:
   a CRC unit configured to:
   modify an input, x, having a first number of bits, to have 64 bits, resulting in a modified input, R(x);
   calculate an x^32 modulus based at least on R(x) and a polynomial, P(x), having a degree of 32;
   extract the coefficients of x^n, wherein n is incremented from 0 to 31; and
   accumulate a cyclic redundancy check (CRC) value, wherein the CRC value comprises the coefficients.

25. The non-transitory computer readable storage medium of claim 24, wherein the CRC unit is configured to calculate the x^32 modulus by:
   calculating a quotient, u, equal to the floor of x^64/P(x);
   calculating a first factor, T1(x), equal to the floor of R(x)/x^32, times u;
   calculating a second factor, T2(x), equal to the floor of T1(x)/x^32, times P(x); and
   calculating a product, C(x), equal to R(x) XOR T2(x) mod x^32.

26. The non-transitory computer readable storage medium of claim 24, wherein the polynomial is 11EDC6F41H.

27. The non-transitory computer readable storage medium of claim 24, wherein the first number of bits is 8, 16, or 32, and the CRC unit is configured to modify the input by padding the input to have 64 bits.

28. The non-transitory computer readable storage medium of claim 24, wherein the first number of bits is 64, and the CRC unit is configured to modify the input by padding the input to have 96 bits and folding the 96 bit input into a 64 bit input.

29. The non-transitory computer readable storage medium of claim 24, wherein the integrated circuit device further comprises a cryptography unit configured to receive the CRC value from the CRC unit and perform a cryptography operation using the CRC value.

30. The non-transitory computer readable storage medium of claim 24, wherein the integrated circuit device further comprises a digital rights management unit configured to receive the CRC value from the CRC unit and perform a digital rights management operation using the CRC value.

31. The non-transitory computer readable storage medium of claim 24, wherein the integrated circuit device further comprises a network transmission data integrity unit configured to receive the CRC value from the CRC unit and perform a network transmission data integrity operation using the CRC value.

* * * * *